(12) United States Patent
Huang et al.

(10) Patent No.: US 9,431,630 B2
(45) Date of Patent: Aug. 30, 2016

(54) PACKAGE STRUCTURE FOR FLEXIBLE ORGANIC LIGHT EMITTING DIODE DEVICE, METHOD FOR PACKAGING THE SAME AND FLEXIBLE DISPLAY DEVICE

(71) Applicant: BOE TECHNOLOGY GROUP CO., LTD., Beijing (CN)

(72) Inventors: Wei Huang, Beijing (CN); Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/415,509

(22) PCT Filed: Jun. 12, 2014

(86) PCT No.: PCT/CN2014/079759
§ 371 (c)(1),
(2) Date: Jan. 16, 2015

(87) PCT Pub. No.: WO2015/032232
PCT Pub. Date: Mar. 12, 2015

(65) Prior Publication Data
US 2015/0364718 A1    Dec. 17, 2015

(30) Foreign Application Priority Data

Sep. 9, 2013 (CN) .......................... 2013 1 0407098

(51) Int. Cl.
*H01L 51/52* (2006.01)
*H01L 51/00* (2006.01)
*H01L 51/56* (2006.01)

(52) U.S. Cl.
CPC ......... *H01L 51/5253* (2013.01); *H01L 51/003* (2013.01); *H01L 51/0097* (2013.01);

(Continued)

(58) Field of Classification Search
CPC ............ H01L 51/003; H01L 51/0097; H01L 51/5253; H01L 51/56
See application file for complete search history.

(56) References Cited

U.S. PATENT DOCUMENTS 8,465,992 B2    6/2013  Kim et al.
2005/0236985 A1    10/2005  Handa et al.
(Continued)

FOREIGN PATENT DOCUMENTS

CN    1341083 A    3/2002
CN    1870844 A    11/2006
(Continued)

OTHER PUBLICATIONS

International Search Report and Written Opinion mailed Aug. 25, 2014 regarding PCT/CN2014/079759. Translation provided by Dragon Intellectual Property Law Firm.
(Continued)

*Primary Examiner* — Allan R Wilson
(74) *Attorney, Agent, or Firm* — Harness, Dickey & Pierce, P.L.C.

(57) ABSTRACT

According to the present disclosure, there is provided a package structure for a flexible organic light emitting diode (OLED) device, which may include: a flexible substrate, arranged to support the OLED device; a packaging layer, provided on the flexible substrate; the OLED device, provided on the packaging layer; and a waterproof and oxygenproof transparent thin film, covering the OLED device.

10 Claims, 2 Drawing Sheets

(52) U.S. Cl.
CPC ....... *H01L51/56* (2013.01); *H01L 2251/5338* (2013.01); *H01L 2251/558* (2013.01); *Y02E 10/549* (2013.01)

(56) References Cited

U.S. PATENT DOCUMENTS

| | | | |
|---|---|---|---|
| 2005/0269943 A1* | 12/2005 | Hack | H01L 51/5237 313/504 |
| 2012/0100647 A1 | 4/2012 | Kim et al. | |
| 2012/0280368 A1* | 11/2012 | Garner | B32B 17/10338 257/629 |
| 2012/0292084 A1* | 11/2012 | Lai | H05K 1/189 174/254 |
| 2012/0305981 A1 | 12/2012 | Park et al. | |
| 2013/0240848 A1* | 9/2013 | Lin | H01L 51/52 257/40 |
| 2015/0069358 A1* | 3/2015 | Chida | H01L 51/5246 257/40 |
| 2015/0108443 A1* | 4/2015 | Huh | H01L 51/5253 257/40 |
| 2015/0123106 A1* | 5/2015 | Yasumoto | B32B 43/006 257/40 |

FOREIGN PATENT DOCUMENTS

| | | |
|---|---|---|
| CN | 101663161 A | 3/2010 |
| CN | 101916022 A | 12/2010 |
| CN | 102636898 A | 8/2012 |
| CN | 102890351 A | 1/2013 |
| CN | 103474580 A | 12/2013 |
| CN | 203406334 U | 1/2014 |
| JP | 2004050565 A | 2/2004 |

OTHER PUBLICATIONS

Chinese Office Action mailed May 5, 2015 regarding Chinese Application No. 201310407098.8. Translation provided by Dragon Intellectual Property Law Firm.
Second Office Action regarding Chinese application No. 201310407098.8, dated Oct. 10, 2015. Translation provided by Dragon Intellectual Property Law Firm.

* cited by examiner

-PRIOR ART-

PACKAGE STRUCTURE FOR FLEXIBLE ORGANIC LIGHT EMITTING DIODE DEVICE, METHOD FOR PACKAGING THE SAME AND FLEXIBLE DISPLAY DEVICE

CROSS-REFERENCE TO RELATED APPLICATION

This application is the U.S. national phase of PCT Application No. PCT/CN2014/079759 filed on Jun. 12, 2014, which claims priority to Chinese Patent Application No. 201310407098.8 filed on Sep. 9, 2013, the disclosures of which are incorporated in their entirety by reference herein.

TECHNICAL FIELD

The present disclosure relates to the field of display technology, and in particular to a package structure for a flexible organic light emitting diode (OLED) device, a method for packaging the same and a flexible display device.

BACKGROUND

An organic light emitting diode (OLED) is a new display technology, display quality of which can be compared with that of the thin film transistor liquid crystal display (TFT-LCD) devices and the price of which is much lower. The OLED has been increasingly becoming the focus of international research and development, due to its significant advantages in the panel display, such as high brightness, rich colors, low-voltage direct-current (DC) driving and simple preparation process. In less than 20 years OLED has entered the stage of industrialization.

In general, an OLED device is formed by depositing a transparent anode, a metal cathode and more than two organic layers sandwiched therebetween on a carrier which is a rigid glass substrate or a flexible polymer substrate. The organic layers typically include a hole injection layer, a hole transport layer, a light-emitting layer, an electron transport layer and an electron injection layer and so on. The OLED device is very sensitive to oxygen and water vapor. If the oxygen and water vapor infiltrate into the OLED device, defects such as black spots, pinholes, electrode oxidations, organic material chemical reactions and the like will be caused, thereby seriously affecting the life of the OLED device.

Therefore, the OLED device needs to be packaged to inhibit the oxygen and water vapor from infiltration. A faceseal is one of the commonly used methods for packaging the OLED device. A faceseal process is generally divided into two steps: firstly, depositing inorganic passivation layer on the OLED device, then attaching a glass substrate having a waterproof and oxygenproof functional organic thin film under a nitrogen ($N_2$) protection. FIG. 1 is a cross-sectional view showing a faceseal structure of a conventional OLED device. As shown in FIG. 1, the faceseal structure of the conventional OLED device is formed by a rigid surface glass substrate 1, an OLED device 2, a passivation layer 3, a to-be-cured resin layer 4 and an adhesive 5. Since both sides of the faceseal structure of the OLED device use rigid glasses as carrier plates, its flexibility, lightness and thinness cannot be achieved.

SUMMARY

Technical Problems to be Solved

A technical problem to be solved by the present disclosure is to provide a package structure for a flexible organic light emitting diode (OLED) device, a method for packaging the same and a flexible display device, thereby being able to prepare a flexible OLED product.

Technical Solutions

To solve the above technical problems, embodiments of the present invention provide the following technical solutions.

In an aspect, there is provided a package structure of a flexible OLED device, which may include:
  a flexible substrate, arranged to support the OLED device;
  a packaging layer, provided on the flexible substrate;
  the OLED device, provided on the packaging layer; and
  a waterproof and oxygenproof transparent thin film, covering the OLED device.

Alternatively, the package structure may further include the flexible substrate, provided on the waterproof and oxygenproof transparent thin film.

Alternatively, the flexible substrate may include: ultra-thin glass, having flexibility; and a waterproof and oxygenproof resin layer, covering the ultra-thin glass.

Alternatively, a size of the waterproof and oxygenproof resin layer may be slightly larger than that of the ultra-thin glass.

Alternatively, both length and width of the waterproof and oxygenproof resin layer may exceed those of the ultra-thin glass by 0.1-2 mm.

Alternatively, a thickness of the ultra-thin glass may be 0.05-0.2 mm and a flexible radius thereof may be 40-80 mm.

Alternatively, a thickness of the waterproof and oxygenproof resin layer may be 0.03-3 mm.

Alternatively, the flexible substrate may include: a metal thin film; and a waterproof and oxygenproof resin layer, covering the metal thin film.

In another aspect, there is provided a flexible display device, including the above package structure for a flexible organic light emitting diode (OLED) device.

Alternatively, the flexible display device may include at least one of electronic papers, televisions (TVs), display devices, digital photo frames, mobile phones and tablet computers.

In yet another aspect, there is provided a method for packaging a flexible organic light emitting diode (OLED) device, which may include:
  providing a first transparent rigid substrate attached with a waterproof and oxygenproof transparent thin film;
  attaching the OLED device on the waterproof and oxygenproof transparent thin film;
  forming a packaging layer on the OLED device;
  providing a second transparent rigid substrate;
  forming a flexible substrate on the second transparent rigid substrate;
  forming a cell by using the first transparent rigid substrate on which the packaging layer is formed and the second transparent rigid substrate on which the flexible substrate is formed, and packaging the first transparent rigid substrate and the second transparent rigid substrate within the cell; and
  removing the first transparent rigid substrate and the second transparent rigid substrate.

Alternatively, the step of forming a flexible substrate on the second transparent rigid substrate may include:
  attaching ultra-thin glass having flexibility on the second transparent rigid substrate; and
  forming a waterproof and oxygenproof resin layer covering the ultra-thin glass on the ultra-thin glass.

Alternatively, the flexible substrate may be further provided between the waterproof and oxygenproof transparent thin film and the first transparent rigid substrate.

Alternatively, the step of forming a flexible substrate on the second transparent rigid substrate may include:

attaching a metal thin film on the second transparent rigid substrate; and forming a waterproof and oxygenproof resin layer covering the metal thin film on the metal thin film.

Alternatively, if an adhesive tape is used to attach the first transparent rigid substrate with the waterproof and oxygenproof transparent thin film and to attach the second transparent rigid substrate with the flexible substrate, then a mechanical method may be applied in the step of removing the first transparent rigid substrate and the second transparent rigid substrate.

Alternatively, if a removable layer is used to attach the first transparent rigid substrate with the waterproof and oxygenproof transparent thin film and to attach the second transparent rigid substrate with the flexible substrate, then an ultraviolet irradiation method may be applied in the step of removing the first transparent rigid substrate and the second transparent rigid substrate.

ADVANTAGEOUS EFFECTS

Embodiments of the present invention at least have the following advantages:

In each of the above technical solutions, the package structure of the OLED device uses the flexible substrate instead of the commonly-used rigid glass in the conventional faceseal technology to carry the OLED device, thereby being able to prepare a flexible OLED product.

BRIEF DESCRIPTION OF THE DRAWINGS

In order to more clearly illustrate the technical solutions according to the embodiments of the present disclosure or the related art, accompany drawings acquired to use in the description of the embodiments will be described briefly below. It is obvious that, the described drawings are merely parts of embodiments of the present disclosure, and other drawings can also be obtained according to these drawings for a person skilled in the art without creative work.

DETAILED DESCRIPTION

Figure 1:
FIG. 1 is a cross-sectional view illustrating a faceseal structure of an OLED device in a related art.

Specific embodiments of the present disclosure will be further described in conjunction with the drawings and the following examples. The following embodiments are only used for illustrating the present disclosure, but are not intended to limit the scope of the present disclosure.

In order to make the objects, technical solutions and advantages of the embodiments of the present disclosure more clear, the technical solutions according to the embodiments of the present disclosure will be clearly and fully described hereinafter in conjunction with the accompanying drawings in the embodiments of the present disclosure. Obviously, the described embodiments are merely parts of embodiments of the present disclosure, but not all the embodiments. Based on the embodiments in the present disclosure, all other embodiments obtained by a person skilled in the art will fall within the protection scope of the present disclosure.

Unless otherwise defined, technical terms or scientific terms used herein shall have the general meaning which can be understood by a person skilled in the art. The terms "first", "second" or the like used in the specification and claims of the present disclosure do not denote any sequence, quantity, or importance, but rather are used to distinguish different components. Similarly, the terms "a" or "an" or the like do not mean quantitative restrictions, but rather indicate the presence of at least one. The terms "connect" or "couple" or the like are not limited to connect physically or mechanically, but may include connecting electrically either directly or indirectly. The terms "up", "down", "left", " right", etc., are merely used to indicate a relative positional relationship; when the absolute position of the described object is changed, the relative positional relationship is changed correspondingly.

With respect to the problem that both sides of the faceseal structure of the OLED device use rigid glasses as carrier plates, thereby flexibility, lightness and thinness of the structure cannot be achieved in the related art, embodiments of the present disclosure provide a package structure for a flexible organic light emitting diode (OLED) device, a method for packaging the same and a flexible display device, thereby being able to prepare a flexible OLED product.

An embodiment of the present disclosure provides a package structure for an OLED device, for example, including:

a flexible substrate, arranged to support the OLED device;

a packaging layer, provided on the flexible substrate;

the OLED device, provided on the packaging layer; and a waterproof and oxygenproof transparent thin film, covering the OLED device.

The package structure of the OLED device provided by the present disclosure uses the flexible substrate instead of the commonly-used rigid glass in the conventional faceseal technology to carry the OLED device, thereby being able to prepare a flexible OLED product.

The package structure may further include:

the flexible substrate, provided on the waterproof and oxygenproof transparent thin film.

Specifically, the flexible substrate may be formed by ultra-thin Mass having flexibility and a waterproof and oxygenproof resin layer covering the ultra-thin glass. A thickness of the ultra-thin glass may be 0.05-0.2 mm and a flexible radius thereof may be 40-80 mm. a thickness of the waterproof and oxygenproof resin layer may be 0.03-3 mm.

Further, the flexible substrate may further be formed by a metal thin film and a waterproof and oxygenproof resin layer covering the metal thin film. At this time, since the flexible substrate is not transparent, the flexible substrate is provided on a side of the OLED device through which light does not transmit, thereby the light emitted by the OLED device will not be affected.

An embodiment of the present disclosure further provides a flexible display device, including the above-described package structure of the flexible OLED device. In the device, the package structure of the flexible OLED device is the same as the above-described embodiment, which will be omitted here. In addition, structures of other parts of the display device can refer to the related art, which are not described in detail herein. The display device may be electronic papers, televisions (TVs), display devices, digital photo frames, mobile phones, tablet computers and other products or parts having any display functions.

An embodiment of the present disclosure further provides a method for packaging a flexible OLED device, for example, including:

providing a first transparent rigid substrate attached with a waterproof and oxygenproof transparent thin film;

attaching the OLED device on the waterproof and oxygenproof transparent thin film;

forming a packaging layer on the OLED device;

providing a second transparent rigid substrate;

forming a flexible substrate on the second transparent rigid substrate;

forming a cell by using the first transparent rigid substrate on which the packaging layer is formed and the second transparent rigid substrate on which the flexible substrate is formed, and packaging the first transparent rigid substrate and the second transparent rigid substrate within the cell; and removing the first transparent rigid substrate and the second transparent rigid substrate.

Specifically, the step of forming a flexible substrate on the second transparent rigid substrate may include:

attaching ultra-thin glass having flexibility on the second transparent rigid substrate; and forming a waterproof and oxygenproof resin layer covering the ultra-thin glass on the ultra-thin glass.

Moreover, the flexible substrate may be further provided between the waterproof and oxygenproof transparent thin film and the first transparent rigid substrate.

Specifically, the step of forming a flexible substrate on the second transparent rigid substrate may include:

attaching a metal thin film on the second transparent rigid substrate; and forming a waterproof and oxygenproof resin layer covering the metal thin film on the metal thin film.

In the method for packaging the OLED device provided by the present disclosure, the flexible substrate is used, instead of the commonly-used rigid glass in the conventional faceseal technology, to carry the OLED device, thereby being able to prepare a flexible OLED product.

The package structure for a flexible OLED device and the method for packaging the same provided by the present disclosure will be detailed described below in conjunction with the drawings and the specific embodiment.

FIG. 1 is a cross-sectional view illustrating a faceseal structure of an OLED device in a related art. In the faceseal process of the related art, firstly, a waterproof and oxygenproof transparent thin film is attached on a rigid glass substrate 1. Specifically, the waterproof and oxygenproof transparent thin film may be a plastic thin film. Then, an OLED device 2 is attached on the plastic thin film. And then a passivation layer 3 covering OLED device 2 is formed on the OLED device 2. Specifically, the passivation layer 3 can be formed by inorganic materials such as silicon nitride. After that, a to-be-cured resin layer 4 is formed on the passivation layer 3. And then by using an adhesive 5, another rigid glass substrate 1 and the above formed structure are packaged within the cell, thereby forming the final faceseal structure of the OLED device. Since both sides of the faceseal structure of the OLED device use rigid glasses as carrier plates, flexibility, lightness and thinness of the structure cannot be achieved.

First Embodiment

To solve the above problem, the present embodiment provides a package structure for a flexible OLED device and a method for packaging the same. As shown in FIGS. 2-7, the method of the present embodiment includes the following steps:

Step a1, forming a flexible substrate.

Figure 2:
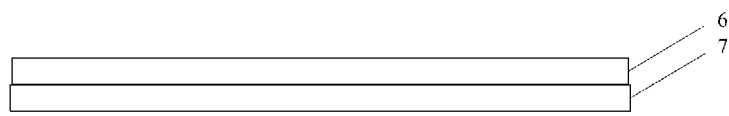
FIG. 2 is a schematic diagram illustrating a structure of a flexible substrate according to an embodiment of the present disclosure.

Specifically, as shown in FIG. 2, an ultra-thin glass 6 covered with a waterproof and oxygenproof resin layer 7 may be used as a flexible substrate. A thickness of the ultra-thin glass is 0.05-0.2 mm, and a flexible radius thereof is 40-80 mm. A waterproof and oxygenproof resin layer covering the ultra-thin glass is formed on the ultra-thin glass. The resin layer is formed by a polymer material having waterproof and oxygenproof capabilities, a thickness thereof is 0.03-3 mm, and the temperature resistance thereof at least satisfies that it should be not deformed under 100 Celsius degrees for at least two hours. The flexible substrate formed by the ultra-thin glass and the waterproof and oxygenproof resin layer has a certain flexibility and also has waterproof and oxygenproof capabilities.

Considering the manufacturing wear and tear, a size of the waterproof and oxygenproof resin layer 7 may be slightly larger than that of the ultra-thin glass 6. Alternatively, both length and width of the resin layer exceed those of the ultra-thin glass by 0.1-2 mm.

Step b1, providing a transparent rigid substrate, attaching the flexible substrate formed in Step a1 on the transparent rigid substrate, and attaching a to-be-cured resin used to absorb water vapor and oxygen in the packaging process on the flexible substrate.

Figure 3:
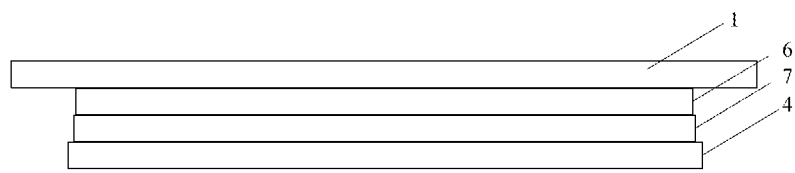
FIG. 3 is a schematic diagram illustrating a structure in which a flexible substrate is attached on a rigid glass according to an embodiment of the present disclosure.

Specifically, as shown in FIG. 3, the transparent rigid substrate may be the rigid glass substrate 1, and the flexible substrate formed in Step a1 may be attached on the rigid glass substrate 1. Specifically, the flexible substrate may be attached on the rigid glass substrate 1 by using an adhesive tape; or by forming a removable layer on the rigid glass substrate 1, the flexible substrate may be attached on the rigid glass substrate 1 provided with the removable layer. A material of the removable layer may be a material which is added with inert substances and decomposable under UV light. After that, the to-be-cured resin 4 used to absorb water vapor and oxygen in the packaging process is attached on the waterproof and oxygenproof resin layer 7.

Step c1, providing a transparent rigid substrate, which is attached with a waterproof and oxygenproof transparent thin film.

Figure 4:
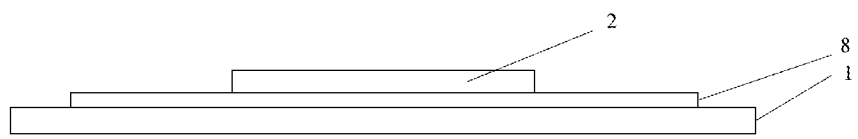
FIG. 4 is a schematic diagram illustrating a structure in which an OLED device is attached on a rigid glass according to an embodiment of the present disclosure.

Specifically, as shown in FIG. 4, the transparent rigid substrate may be the rigid glass substrate 1. The waterproof and oxygenproof transparent thin film 8 may be a plastic thin film. The waterproof and oxygenproof transparent thin film 8 may be attached on the rigid glass substrate 1 by using the adhesive tape; or by forming the removable layer on the rigid glass substrate 1, the waterproof and oxygenproof transparent thin film 8 may be attached on the rigid glass substrate 1 provided with the removable layer. The material of the removable layer may be a material which is added with inert substances and decomposable under UV light.

Step d1, forming an OLED device, a passivation layer and a to-be-cured resin layer on the waterproof and oxygenproof transparent thin film sequentially.

Figure 5:
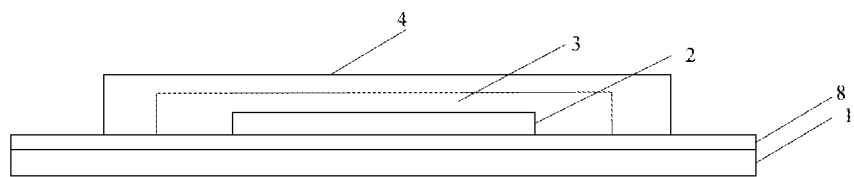
FIG. 5 is a schematic diagram illustrating a structure in which a to-be-cured resin layer is formed on an OLED device according to an embodiment of the present disclosure.

As shown in FIG. 5, similarly to the conventional faceseal process, the OLED device 2, the passivation layer 3 and the to-be-cured resin layer 4 are formed sequentially on the waterproof and oxygenproof transparent thin film 8. Here, the OLED device 2 may be a bottom-emitting OLED device, or a top-emitting OLED device.

Step e1, packaging the structure formed in Step b1 and the structure formed in Step d1 together.

Figure 6:
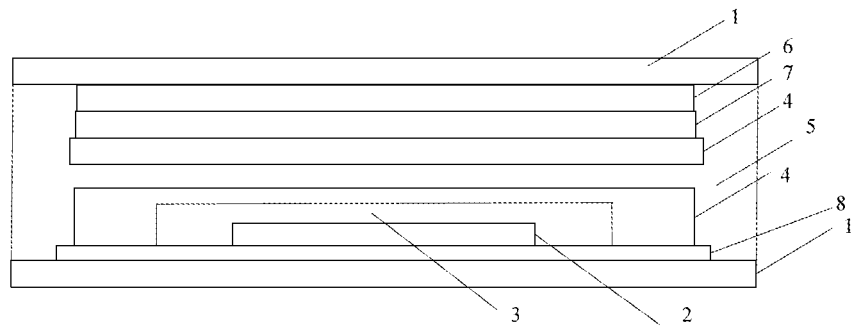
FIG. 6 is a schematic diagram illustrating a structure in which two rigid glasses are arranged to form a cell and have the two rigid glasses packaged within the cell according to an embodiment of the present disclosure.

Specifically, conventional faceseal devices can be used in the step of packaging the structure formed in Step b1 and the structure formed in Step d1 together by using the adhesives 5 to form the structure as shown in FIG. 6.

Step f1, removing the transparent rigid substrates for carrying the structures on both sides.

Figure 7:
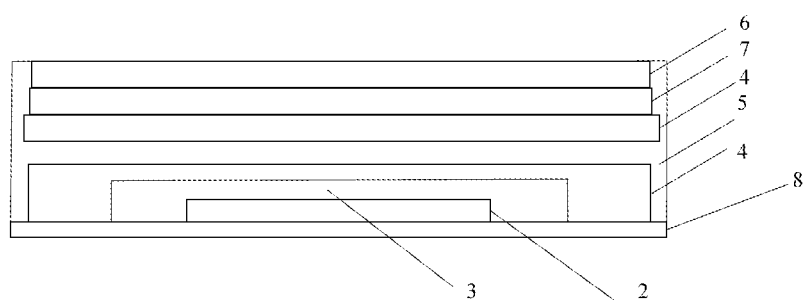
FIG. 7 is a schematic diagram illustrating a structure in which two rigid glasses are removed according to an embodiment of the present disclosure.

As shown in FIG. 7, the rigid glass substrates 1 for carrying the structures on both sides are removed, thereby the package structure for the flexible OLED device of the present embodiment is obtained.

If the adhesive tape is used to attach the rigid glass substrate and the flexible substrate, and to attach the rigid glass substrate and the waterproof and oxygenproof transparent thin film, then a mechanical method is applied in the step of removing the rigid glass substrate. Alternatively, if the removable layer is used to attach the rigid Mass substrate and the flexible substrate, and to attach the rigid glass substrate and the waterproof and oxygenproof transparent thin film, then an ultraviolet irradiation method is applied in the step of removing the rigid glass substrate.

The flexible substrate provided by the present embodiment is formed by the ultra-thin glass and the transparent resin layer; therefore the flexible substrate is also transparent, which will not affect the light emitting of the OLED device. In addition, the technical solutions of the present embodiment are suitable for both the bottom-emitting OLED device and the top-emitting OLED device.

In the package structure for the flexible OLED device according to the present embodiment, the flexible substrate is used to carry the OLED device and the flexible substrate is formed by the ultra-thin glass and the waterproof and oxygenproof resin layer. Since the ultra-thin glass has a certain flexibility and good waterproof and oxygenproof capabilities, the waterproof and oxygenproof resin layer attached herewith can better mitigate the stress and improve the waterproof and oxygenproof capabilities. Since both the waterproof and oxygenproof transparent thin film and the flexible substrate have certain flexibilities, the prepared package structure for the flexible OLED device is flexible; thereby they can be used to prepare a flexible OLED product. In addition, conventional faceseal devices can be used to accomplish the above packaging process to reduce the investment on the thin film flexible packaging devices which are expensive and of low productivity.

Second Embodiment

In the first embodiment, in the package structure for the flexible OLED device finally formed, one side thereof is the flexible substrate and the other side thereof is the waterproof and oxygenproof transparent thin film. In order to further improve the packaging effect, both sides of the package structure for the flexible OLED device can be flexible substrates. The packaging method according to the present embodiment may include the following steps:

Step a2, forming a flexible substrate.

Specifically, as shown in FIG. 2, the ultra-thin glass 6 covered with the waterproof and oxygenproof resin layer 7 can be used as the flexible substrate. a thickness of the ultra-thin glass is 0.05-0.2 mm, a flexible radius thereof is 40-80 mm. the waterproof and oxygenproof resin layer covering ultra-thin glass is formed on the ultra-thin glass and formed with a polymer material having waterproof and oxygenproof capabilities. A thickness of the resin layer is 0.03-3 mm; and the temperature resistance thereof at least satisfies that it should be not deformed for at least two hours under 100 Celsius degrees. The flexible substrate formed by the ultra-thin glass and the waterproof and oxygenproof resin layer has a certain flexibility and also has waterproof and oxygenproof capabilities.

Considering the manufacturing wear and tear, a size of the waterproof and oxygenproof resin layer 7 may be slightly larger than that of the ultra-thin glass 6. Alternatively, both length and width of the resin layer exceed those of the ultra-thin glass by 0.1-2 mm.

Step b2, providing a transparent rigid substrate, attaching the flexible substrate formed in Step a2 on the transparent rigid substrate, and attaching a to-be-cured resin used to absorb water vapor and oxygen in the packaging process on the flexible substrate.

Specifically, as shown in FIG. 3, the transparent rigid substrate may be the rigid glass substrate 1, and the flexible substrate formed in Step a2 may be attached on the rigid glass substrate 1. Specifically, the flexible substrate may be attached on the rigid glass substrate 1 by using an adhesive tape; or by forming a removable layer on the rigid glass substrate 1, the flexible substrate may be attached on the rigid glass substrate 1 provided with the removable layer. A material of the removable layer may be a material which is added with inert substances and decomposable under UV light. After that, the to-be-cured resin 4 used to absorb water vapor and oxygen in the packaging process is attached on the waterproof and oxygenproof resin layer 7.

Step c2, providing a transparent rigid substrate, which is attached with the flexible substrate formed in Step a2, and the flexible substrate is attached with a waterproof and oxygenproof transparent thin film.

Specifically, the transparent rigid substrate may be the rigid glass substrate. The waterproof and oxygenproof transparent thin film may be a plastic thin film. The flexible substrate may be attached on the rigid glass substrate by using the adhesive tape; or by forming the removable layer on the rigid glass substrate, the flexible substrate may be attached on the rigid glass substrate provided with the removable layer. The material of the removable layer may be a material which is added with inert substances and decomposable under UV light.

Step d2, forming an OLED device, a passivation layer and a to-be-cured resin layer on the waterproof and oxygenproof transparent thin film sequentially.

Similarly to the conventional faceseal process, the OLED device, the passivation layer and the to-be-cured resin layer are formed sequentially on the waterproof and oxygenproof transparent thin film. Here, the OLED device may be a bottom-emitting OLED device, or a top-emitting OLED device.

Step e2, packaging the structure formed in Step b2 and the structure formed in Step d2 together.

Specifically, conventional faceseal devices can be used in the step of packaging the structure formed in Step b2 and the structure formed in Step d2 together by using the adhesives 5.

Step f2, removing the transparent rigid substrates for carrying the structures on both sides.

The rigid glass substrates for carrying the structures on both sides are removed; thereby the package structure for the flexible OLED device of the present embodiment is obtained.

If the adhesive tape is used to attach the rigid glass substrate and the flexible substrate, then a mechanical method is applied in the step of removing the rigid glass substrate. Alternatively, if the removable layer is used to attach the rigid glass substrate and the flexible substrate, then an ultraviolet irradiation method is applied in the step of removing the rigid glass substrate.

The flexible substrate provided by the present embodiment is formed by the ultra-thin glass and the transparent resin layer; therefore the flexible substrate is also transparent, which will not affect the light emitting of the OLED device. The technical solutions of the present embodiment are suitable for both the bottom-emitting OLED device and the top-emitting OLED device.

In the package structure for the flexible OLED device according to the present embodiment, the flexible substrate is used to carry the OLED device and the flexible substrate is formed by the ultra-thin glass and the waterproof and oxygenproof resin layer. Since the ultra-thin glass has a certain flexibility and good waterproof and oxygenproof capabilities, the waterproof and oxygenproof resin layer attached herewith can better mitigate the stress and improve the waterproof and oxygenproof capabilities. Since the flexible substrate has certain flexibility, the prepared package structure for the flexible OLED device is flexible; thereby they can be used to prepare a flexible OLED product. In addition, conventional faceseal devices can be used to accomplish the above packaging process to reduce the investment on the thin film flexible packaging devices which are expensive and of low productivity.

Third Embodiment

In the first and second embodiments, the ultra-thin glass and the waterproof and oxygenproof resin layer are used to constitute the flexible substrate. In the present embodiment, a metal thin film and a waterproof and oxygenproof resin layer can be used to constitute the flexible substrate. The packaging method according to the present embodiment may include the following steps:

Step a3, forming a flexible substrate.

Specifically, a metal thin film covered with a waterproof and oxygenproof resin layer can be used to be the flexible substrate. The metal thin film is covered with the waterproof and oxygenproof resin layer. The resin layer is formed with a polymer material having waterproof and oxygenproof capabilities, a thickness thereof is 0.03-3 mm, and the temperature resistance thereof at least satisfies that it should be not deformed for at least two hours under 100 Celsius degrees.

Considering the manufacture wear and tear, a size of the waterproof and oxygenproof resin layer may be slightly larger than that of the metal thin film. Alternatively, both length and width of the resin layer exceed those of the metal thin film by 0.1-2 mm.

Step b3, providing a transparent rigid substrate, attaching the flexible substrate formed in Step a3 on the transparent rigid substrate, and attaching a to-be-cured resin used to absorb water vapor and oxygen in the packaging process on the flexible substrate.

Specifically, the transparent rigid substrate may be the rigid glass substrate, and the flexible substrate formed in Step a3 may be attached on the rigid glass substrate. Specifically, the flexible substrate may be attached on the rigid glass substrate by using an adhesive tape; or by forming a removable layer on the rigid glass substrate, the flexible substrate may be attached on the rigid glass substrate provided with the removable layer. A material of the removable layer may be a material which is added with inert substances and decomposable under UV light. After that, the to-be-cured resin used to absorb water vapor and oxygen in the packaging process is attached on the waterproof and oxygenproof resin layer.

Step c3, providing a transparent rigid substrate, which is attached with a waterproof and oxygenproof transparent thin film.

Specifically, the transparent rigid substrate may be the rigid glass substrate. The waterproof and oxygenproof transparent thin film may be a plastic thin film. The waterproof and oxygenproof transparent thin film may be attached on the rigid glass substrate by using the adhesive tape; or by forming the removable layer on the rigid glass substrate, the waterproof and oxygenproof transparent thin film may be attached on the rigid glass substrate provided with the removable layer. The material of the removable layer may be a material which is added with inert substances and decomposable under UV light.

Step d3, forming an OLED device, a passivation layer and a to-be-cured resin layer on the waterproof and oxygenproof transparent thin film sequentially.

Similarly to the conventional faceseal process, the OLED device, the passivation layer and the to-be-cured resin layer are formed sequentially on the waterproof and oxygenproof transparent thin film. Therefore, the flexible substrate is not transparent. Thus, the OLED device is a bottom-emitting OLED device.

Step e3, packaging the structure formed in Step b3 and the structure formed in Step d3 together.

Specifically, conventional faceseal devices can be used in the step of packaging the structure formed in Step b3 and the structure formed in Step d3 together by using the adhesives.

Step f3, removing the transparent rigid substrates for carrying the structures on both sides.

The rigid glass substrates for carrying the structures on both sides are removed; thereby the package structure for the flexible OLED device of the present embodiment is obtained.

If the adhesive tape is used to attach the rigid glass substrate and the flexible substrate, and to attach the rigid glass substrate and the waterproof and oxygenproof transparent thin film, then a mechanical method is applied in the step of removing the rigid glass substrate. Alternatively, if the removable layer is used to attach the rigid glass substrate and the flexible substrate, and to attach the rigid glass substrate and the waterproof and oxygenproof transparent thin film, then an ultraviolet irradiation method is applied in the step of removing the rigid glass substrate.

The flexible substrate provided by the present embodiment is constituted by the metal thin film and the transparent resin layer; therefore, the flexible substrate is not transparent. In order to not affect the light emitting of the OLED device, the technical solutions of the present embodiment are suitable for the bottom-emitting OLED device.

In the package structure for the flexible OLED device according to the present embodiment, the flexible substrate is used to carry the OLED device and the flexible substrate is constituted by the metal thin film and the waterproof and oxygenproof resin layer. Since the metal thin film has a certain flexibility and good waterproof and oxygenproof capabilities, the waterproof and oxygenproof resin layer attached herewith can better mitigate the stress and improve the waterproof and oxygenproof capabilities. Since both the waterproof and oxygenproof transparent thin film and the flexible substrate have certain flexibilities, the prepared package structure for the flexible OLED device is flexible; thereby they can be used to prepare a flexible OLED product. In addition, conventional faceseal devices can be used to accomplish the above packaging process to reduce the investment on the thin film flexible packaging devices which are expensive and of low productivity.

The above is only preferred embodiments of the present disclosure, it should be noted that several improvements and modifications may be made for a person skilled in the art without departing from the principle of the present disclosure, and also should be considered to fall within the protection scope of the present disclosure.

What is claimed is:

1. A package structure for a flexible organic light emitting diode (OLED) device, comprising:
    a flexible substrate, arranged to support the OLED device;
    a packaging layer, provided on the flexible substrate;
    the OLED device, provided on the packaging layer; and
    a waterproof and oxygenproof transparent thin film, covering the OLED device;
    wherein the packaging layer comprises a passivation layer and a to-be-cured resin layer;
    wherein the flexible substrate comprises an ultra-thin glass having flexibility and a waterproof and oxygenproof resin layer covering the ultra-thin glass;
    wherein a size of the waterproof and oxygenproof resin layer is slightly larger than that of the ultra-thin glass such that both a length and a width of the waterproof and oxygenproof resin layer respectively exceed a length and a width of the ultra-thin glass by 0.1 mm-2 mm;
    wherein a thickness of the ultra-thin glass is 0.05 mm-0.2 mm and a flexible radius of the ultra-thin glass is 40 mm-80 mm; and
    wherein a thickness of the waterproof and oxygenproof resin layer is 0.03 mm-3 mm, and a temperature resistance of the waterproof and oxygenproof resin layer at least satisfies that the waterproof and oxygenproof resin layer is capable of remaining undeformed under 100 degrees Celsius for at least two hours.

2. The package structure for the flexible OLED device according to claim 1, further comprising:
    a further flexible substrate, provided on the waterproof and oxygenproof transparent thin film.

3. A method for packaging the flexible organic light emitting diode (OLED) device according to claim 1, comprising:
    providing a first transparent rigid substrate attached with a waterproof and oxygenproof transparent thin film;
    attaching the OLED device on the waterproof and oxygenproof transparent thin film;
    forming a packaging layer on the OLED device;
    providing a second transparent rigid substrate;
    forming a flexible substrate on the second transparent rigid substrate;
    forming a cell by using the first transparent rigid substrate on which the packaging layer is formed and the second transparent rigid substrate on which the flexible substrate is formed, and packaging the first transparent rigid substrate and the second transparent rigid substrate within the cell; and
    removing the first transparent rigid substrate and the second transparent rigid substrate.

4. The method according to claim 3, wherein the step of forming a flexible substrate on the second transparent rigid substrate comprises:
    attaching ultra-thin glass having flexibility on the second transparent rigid substrate; and
    forming a waterproof and oxygenproof resin layer covering the ultra-thin glass on the ultra-thin glass.

5. The method according to claim 3, wherein the flexible substrate is further provided between the waterproof and oxygenproof transparent thin film and the first transparent rigid substrate.

6. The method according to claim 3, wherein the step of forming a flexible substrate on the second transparent rigid substrate comprises:
    attaching a metal thin film on the second transparent rigid substrate; and
    forming a waterproof and oxygenproof resin layer covering the metal thin film on the metal thin film.

7. The method according to claim 3, wherein
    if an adhesive tape is used to attach the first transparent rigid substrate with the waterproof and oxygenproof transparent thin film and to attach the second transparent rigid substrate with the flexible substrate, then a mechanical method is applied in the step of removing the first transparent rigid substrate and the second transparent rigid substrate; or
    if a removable layer is used to attach the first transparent rigid substrate with the waterproof and oxygenproof transparent thin film and to attach the second transparent rigid substrate with the flexible substrate, then an ultraviolet irradiation method is applied in the step of removing the first transparent rigid substrate and the second transparent rigid substrate.

8. A flexible display device, which comprises a package structure for a flexible organic light emitting diode (OLED) device, the flexible display device comprising:
    a flexible substrate, arranged to support the OLED device;
    a packaging layer, provided on the flexible substrate;
    the OLED device, provided on the packaging layer; and
    a waterproof and oxygenproof transparent thin film, covering the OLED;
    wherein the packaging layer comprises a passivation layer and a to-be-cured resin layer;
    wherein the flexible substrate comprises an ultra-thin glass having flexibility and a waterproof and oxygenproof resin layer covering the ultra-thin glass;
    wherein a size of the waterproof and oxygenproof resin layer is slightly larger than that of the ultra-thin glass such that both a length and a width of the waterproof and oxygenproof resin layer respectively exceed a length and a width of the ultra-thin glass by 0.1 mm-2 mm;
    wherein a thickness of the ultra-thin glass is 0.05 mm-0.2 mm and a flexible radius of the ultra-thin glass is 40 mm-80 mm; and
    wherein a thickness of the waterproof and oxygenproof resin layer is 0.03 mm-3 mm, and a temperature resistance of the waterproof and oxygenproof resin layer at least satisfies that the waterproof and oxygenproof resin layer is capable of remaining undeformed under 100 degrees Celsius for at least two hours.

9. The flexible display device according to claim 8, wherein
    the flexible display device comprises at least one of electronic papers, televisions (TVs), display devices, digital photo frames, mobile phones and tablet computers.

10. The flexible display device according to claim 8, further comprising:
    a further flexible substrate, provided on the waterproof and oxygenproof transparent thin film.

* * * * *